(12) United States Patent
Choi et al.

(10) Patent No.: US 7,768,011 B2
(45) Date of Patent: Aug. 3, 2010

(54) ELECTRO-LUMINESCENCE DEVICE INCLUDING A THIN FILM TRANSISTOR AND METHOD OF FABRICATING AN ELECTRO-LUMINESCENCE DEVICE

(75) Inventors: Joon-Hoo Choi, Seoul (KR); In-Su Joo, Seongnam-si (KR); Beom-Rak Choi, Seoul (KR); Jong-Moo Huh, Gyeonggi-do (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 12/389,058

(22) Filed: Feb. 19, 2009

(65) Prior Publication Data
US 2009/0152557 A1 Jun. 18, 2009

Related U.S. Application Data

(60) Continuation of application No. 11/858,287, filed on Sep. 20, 2007, now Pat. No. 7,501,658, which is a division of application No. 10/761,607, filed on Jan. 21, 2004, now Pat. No. 7,288,477.

(30) Foreign Application Priority Data

Jul. 18, 2003 (KR) ............................. 2003-49400

(51) Int. Cl.
*H01L 33/00* (2010.01)
(52) U.S. Cl. ............... 257/59; 257/83; 257/E33.004
(58) Field of Classification Search ................. 257/59, 257/79, 83, E33.004, E33.053; 313/504; 438/637
See application file for complete search history.

(56) References Cited

FOREIGN PATENT DOCUMENTS

| CN | 1158496 | 9/1997 |
|---|---|---|
| CN | 1372240 | 10/2002 |

*Primary Examiner*—Roy K Potter
(74) *Attorney, Agent, or Firm*—F. Chau & Associates, LLC

(57) ABSTRACT

An electro-luminescence device including an electro-luminescence element and a thin film transistor electrically connected to the electro-luminescence element. The thin film transistor includes a gate electrode formed over a substrate, an insulating layer formed over the gate electrode, and a first semiconductor pattern formed over the insulating layer. An etch stop layer is formed over the first semiconductor layer. A second semiconductor pattern is formed over the etch stop layer at one side of the etch stop layer, and a third semiconductor pattern is formed over the etch stop layer at another side of the etch stop layer. A source electrode is formed over the second semiconductor pattern, and a drain electrode is formed over the third semiconductor pattern.

14 Claims, 8 Drawing Sheets

ELECTRO-LUMINESCENCE DEVICE INCLUDING A THIN FILM TRANSISTOR AND METHOD OF FABRICATING AN ELECTRO-LUMINESCENCE DEVICE

CROSS-REFERENCE TO RELATED APPLICATIONS

This application is a Continuation of U.S. patent application Ser. No. 11/858,287, filed on Sep. 20, 2007 now U.S. Pat. No. 7,501,658, which is a divisional of U.S. patent application Ser. No. 10/761,607 filed on Jan. 21, 2004, now U.S. Pat. No. 7,288,477, which claims priority to Korean Patent Application No.: 2003-49400, filed on Jul. 18, 2003, the contents of which are each incorporated by reference herein in their entireties.

BACKGROUND

1. Technical Field

The present disclosure relates to a thin film transistor (TFT) for an electro-luminescence (EL) device and a method of fabricating the same.

2. Disclosure of Related Art

Display devices have many applications and act as an interface between electrical devices, such as computers and televisions, and a user. Display devices operate by changing information in the form of electrical signals into an image and providing the image to the user.

Display devices may be classified into an emissive display device, such as, for example, a cathode ray tube (CRT), a plasma display panel (PDP), a light emitting diode (LED), and an organic electro-luminescent display device (ELD), or a non-emissive display device, such as, for example, a liquid crystal display (LCD), an electrochemical display (ECD), and an electrophoretic image display (EPID).

CRT displays have been widely used for televisions or as a computer monitor because of their display quality and low cost. However, CRT image displays have disadvantages, such as, for example, flickering, heavy weight, large physical size, and high power consumption.

Flat panel display devices, such as LCDs, have rapidly grown in popularity due to their excellent display quality, low power consumption, small physical size, and light weight.

An electro-luminescence display device is another example of a flat panel display device. Electro-luminescence display devices are classified as organic electro-luminescence display devices or inorganic electro-luminescence display devices.

Inorganic electro-luminescence display devices apply a high electric field to a light emitting portion, thereby exciting the light emitting portion to emit light. To generate the light, the inorganic electro-luminescence display device needs a driving voltage from about 100 to about 200 volts.

Conventional organic electro-luminescence display devices include an organic electro-luminescent layer disposed between two electrodes. When an electron and a hole are injected into the electro-luminescent layer from the two electrodes, respectively, the organic electro-luminescence display device generates an exciton by coupling the electron to the hole, and generates light when the exciton is changed from an excitation state to a ground state. The organic electro-luminescence display device needs a driving voltage from about 5 to about 20 volts to generate the light. Organic electro-luminescence display devices have characteristics, such as, for example, a wide visual angle, a high response speed, and a high contrast.

Organic electro-luminescence display devices are applicable to active matrix type display devices and to passive matrix type display devices. The active matrix type electro-luminescence display device independently drives organic electro-luminescence display devices corresponding to pixels using a switching device such as a thin film transistor.

Conventional organic electro-luminescence display devices include a semiconductor layer (or a channel layer) or a lightly doped deposition (LDD) structure formed using a polysilicon having electrical properties superior to that of amorphous silicon.

When a semiconductor layer of a thin film transistor used in a conventional organic electro-luminescence display device is formed using polysilicon, or is formed in the LDD structure, the thin film transistor may have a complicated structure, the manufacturing time for the thin film transistor may be great, and a defect ratio of the thin film transistor may be high because of it's complicated structure.

Accordingly, an electro-luminescence display device using amorphous silicon and $n^+$ amorphous silicon into which an n-type dopant is injected has been proposed.

However, when amorphous silicon and $n^+$ amorphous silicon are used to form an electro-luminescence display device, the amorphous silicon may be partially etched back during patterning of the $n^+$ amorphous silicon. As a result, the amount of current flowing through the amorphous silicon may be changed, thereby deteriorating the quality of the displayed image.

Also, when the $n^+$ amorphous silicon is etched by an etch-back process, the etch uniformity of the $n^+$ amorphous silicon may be deteriorated, thereby further diminishing display quality.

SUMMARY OF THE INVENTION

An electro-luminescence device according to an embodiment of the invention includes an electro-luminescence element and a thin film transistor electrically connected to the electro-luminescence element. The thin film transistor includes a gate electrode formed over a substrate, an insulating layer formed over the gate electrode, and a first semiconductor pattern formed over the insulating layer. An etch stop layer is formed over the first semiconductor layer. A second semiconductor pattern is formed over the etch stop layer at one side of the etch stop layer, and a third semiconductor pattern is formed over the etch stop layer at another side of the etch stop layer. A source electrode is formed over the second semiconductor pattern, and a drain electrode is formed over the third semiconductor pattern.

An electro-luminescence device according to another embodiment of the invention includes a gate bus line extending in a first direction over a substrate, a data bus line extending in a second direction over the substrate, a power supply line extending parallel to the data bus line over the substrate, and a switching transistor electrically connected to the gate bus line. The switching transistor includes a first gate electrode extending from the gate bus line, a first semiconductor pattern formed over the first gate electrode, and a first etch stop layer formed over the first semiconductor pattern. A second semiconductor pattern is formed over the first semiconductor pattern at one side of the first etch stop layer, and a third semiconductor pattern is formed over the first semiconductor pattern at another side of the first etch stop layer. A first source electrode is formed over the second semiconductor pattern and extends from the data bus line. A first drain electrode is formed over the third semiconductor pattern. A driving transistor is electrically connected to the power supply line. The driving transistor includes a second gate electrode electrically connected to the first drain electrode of the switching transistor. A fourth semiconductor pattern is formed over the second gate electrode, and a second etch stop layer is formed over the fourth semiconductor pattern. A fifth semiconductor pattern is formed over the fourth semiconductor pattern at one side of the second etch stop layer, and a sixth semiconductor pattern is formed over the fourth semiconductor pattern at another side of the second etch stop layer. A second source electrode is formed over the fifth semiconductor layer and extends from the power supply line. A second drain electrode is formed over the sixth semiconductor layer. An electro-luminescence element is electrically connected to the second drain electrode of the driving transistor.

A method of forming an electro-luminescence device according to an embodiment of the invention includes forming a gate bus line extending in a first direction over a substrate, forming a data bus line extending in a second direction over the substrate, forming a power supply line extending parallel to the data bus line over the substrate, and forming a switching transistor electrically connected to the gate bus line. The step of forming a switching transistor includes forming a first gate electrode extending from the gate bus line, forming a first semiconductor pattern over the first gate electrode, and forming a first etch stop pattern over the first semiconductor pattern. A second semiconductor pattern is formed over the first semiconductor pattern at one side of the first etch stop pattern. A third semiconductor pattern is formed over the first semiconductor pattern at another side of the first etch stop pattern. A first source electrode is formed over the second semiconductor pattern, and the first source electrode extends from the data bus line. A first drain electrode is formed over the third semiconductor pattern. A driving transistor is electrically connected to the power supply line. The step of forming a driving transistor includes forming a second gate electrode electrically connected to the first drain electrode of the switching transistor, forming a fourth semiconductor pattern over the second gate electrode, and forming a second etch stop pattern over the fourth semiconductor pattern. A fifth semiconductor pattern is formed over the fourth semiconductor pattern at one side of the second etch stop pattern, and a sixth semiconductor pattern is formed over the fourth semiconductor pattern at another side of the second etch stop pattern. A second source electrode is formed over the fifth semiconductor layer, and the second source electrode extends from the power supply line. A second drain electrode is formed over the sixth semiconductor layer. An electro-luminescence element is electrically connected to the second drain electrode of the driving transistor.

In at least one embodiment of the invention, the gate bus line, the first gate electrode and the second gate electrode are formed simultaneously by etching a gate metal thin layer.

In at least one embodiment of the invention, the first and second etch stop patterns are formed simultaneously by etching an etch stop layer.

In at least one embodiment of the invention, the data bus line, the power supply line, the first and second drain electrodes, and the first and second source electrodes are formed simultaneously by etching a source/drain metal thin layer formed over first and second semiconductor layers. The first, second, third, fourth, fifth and sixth semiconductor patterns are formed simultaneously by etching the first and second semiconductor layers using the data bus line, the power supply line, the first and second drain electrodes and the first and second source electrodes as a mask, and the first and second etch stop patterns prevent portions of the first and second semiconductor layers from being etched.

BRIEF DESCRIPTION OF THE DRAWINGS

The present invention will become readily apparent by reference to the following detailed description when considered in conjunction with the accompanying drawings wherein.

DETAILED DESCRIPTION OF PREFERRED EMBODIMENTS

Figure 1:
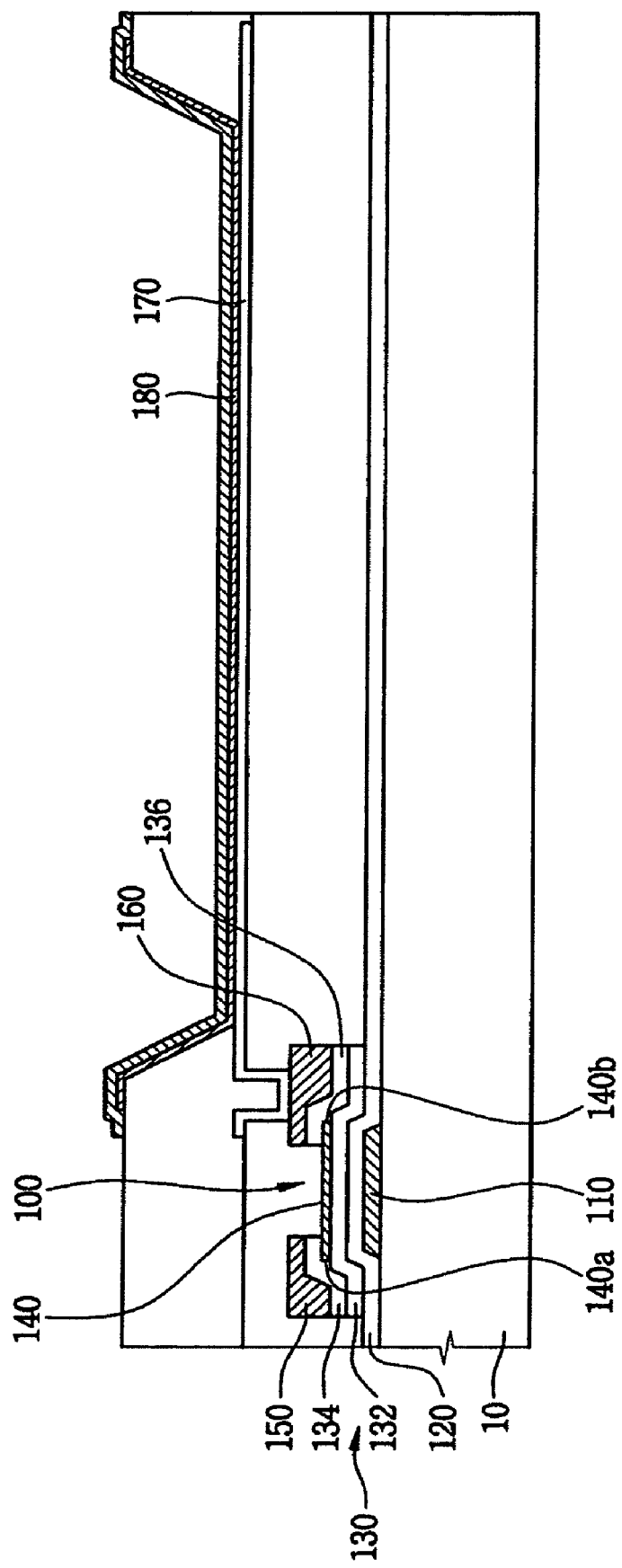
FIG. 1 is a schematic cross-sectional view of a thin film transistor for an electro-luminescence device according to an exemplary embodiment of the present invention.

FIG. 1 is a schematic cross-sectional view of a thin film transistor for an electro-luminescence device according to an exemplary embodiment of the present invention.

Referring to FIG. 1, a thin film transistor 100 according to the present embodiment of the invention includes a first electrode 110, an insulating layer 120, a semiconductor pattern 130, an etch stop layer 140, a second electrode 150 and a third electrode 160. The thin film transistor 100 is formed on a substrate 10.

The first electrode 110 is formed on the substrate 110 using a conductive thin film layer having low electric resistance, such as, for example, aluminum, aluminum alloy, copper, or copper alloy. The first electrode 110 receives a voltage higher than a threshold voltage of the semiconductor pattern 130 to lower the electric resistance of the semiconductor pattern 130.

The insulating layer 120 is formed over the substrate 10 to cover the first electrode 110. The insulating layer 120 is formed of silicon oxide ($SiO_x$), silicon nitride ($SiN_x$) or the like.

The semiconductor pattern 130 is formed on the insulating layer 120. The semiconductor pattern 130 includes a first semiconductor pattern 132, a second semiconductor pattern 134 and a third semiconductor pattern 136. The first semiconductor pattern 132 is formed by patterning an amorphous silicon film, and the second and third semiconductor patterns 134 and 136 are formed by patterning an n+ amorphous silicon film doped with n-type dopant.

The first semiconductor pattern 132 is formed on the insulating layer 120 to cover the first electrode 110. The first semiconductor pattern 132 has an area wider than that of the first electrode 110. The first semiconductor pattern 132 has an electric resistance that is lowered when a voltage higher than the threshold voltage is applied to the first electrode 110.

The second and third semiconductor patterns 134 and 136 are formed on the first semiconductor pattern 132, and spaced apart from each other by a predetermined distance.

The etch stop layer 140 is formed on the first semiconductor pattern 132. A first end 140a of the etch stop layer 140 is overlapped with a portion of the second semiconductor pattern 134 and a second end 140b of the etch stop layer 140 is overlapped with a portion of the third semiconductor pattern 136. The etch stop layer 140 may prevent an etch-back of the first semiconductor pattern 132 during patterning of the second and third semiconductor patterns 134 and 136, thereby preventing change in an amount of current flowing through the first semiconductor pattern 132. The etch stop layer 140 has a thickness of about 100 Å to about 200 Å, and is made of, for example, silicon nitride or silicon oxide.

The second and third electrodes 150 and 160 are electrically connected to the second and third semiconductor patterns 134 and 136, respectively. The second electrode 150 has the same area and shape as the second semiconductor pattern 134 and the third electrode 160 has the same area and shape as the third semiconductor pattern 136. The second and third electrodes 150 and 160 are formed of, for example, aluminum or aluminum alloy. The third electrode 160 is connected to an anode electrode 170 disposed at a side of an organic light emitting layer 180 and provides a driving current output to the anode electrode 170.

According to this exemplary embodiment of the invention, the etch stop layer is formed between the n+ amorphous silicon film and the amorphous silicon film disposed under the n+ amorphous silicon film to prevent the amorphous silicon film from being etched while the n+ amorphous silicon film is patterned. Thus, the current amount flowing through the amorphous silicon film is not changed, thereby preventing deterioration of display quality.

Figure 2:
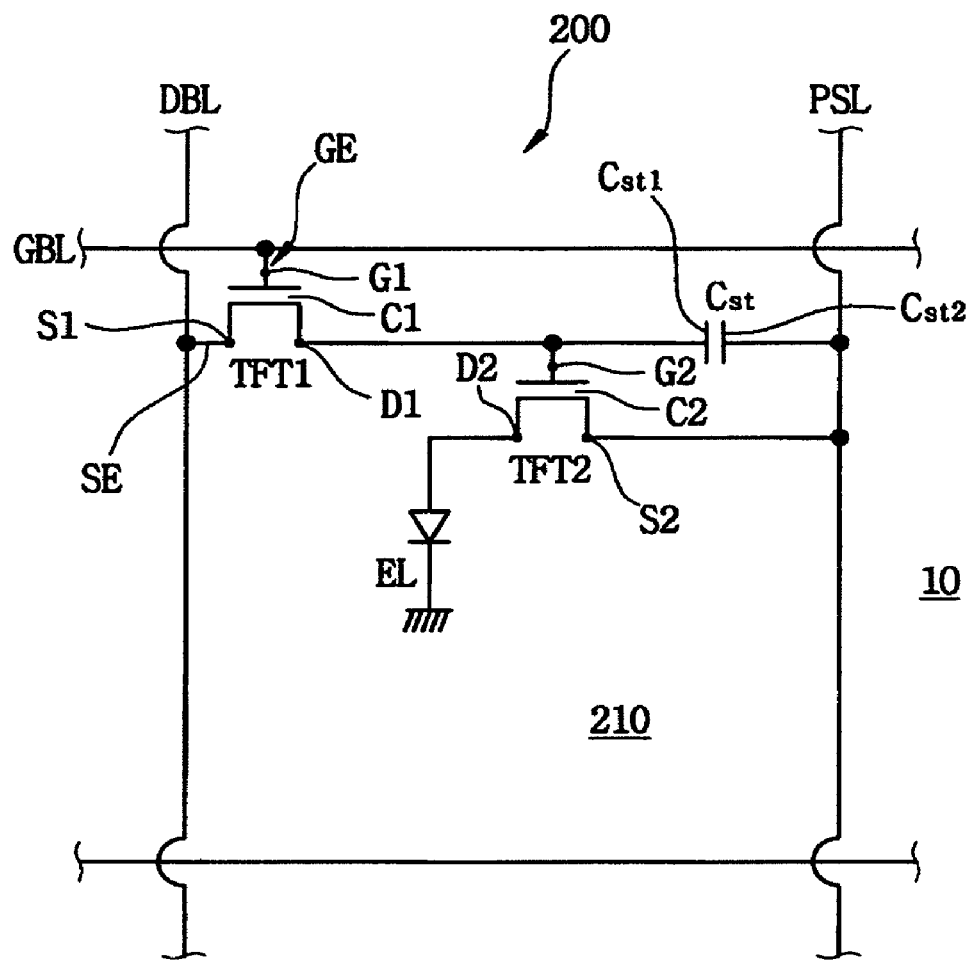
FIG. 2 is a schematic circuit diagram of an electro-luminescence device according to an exemplary embodiment of the present invention.
Figure 2:
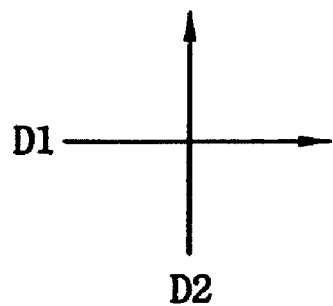
Figure 3:
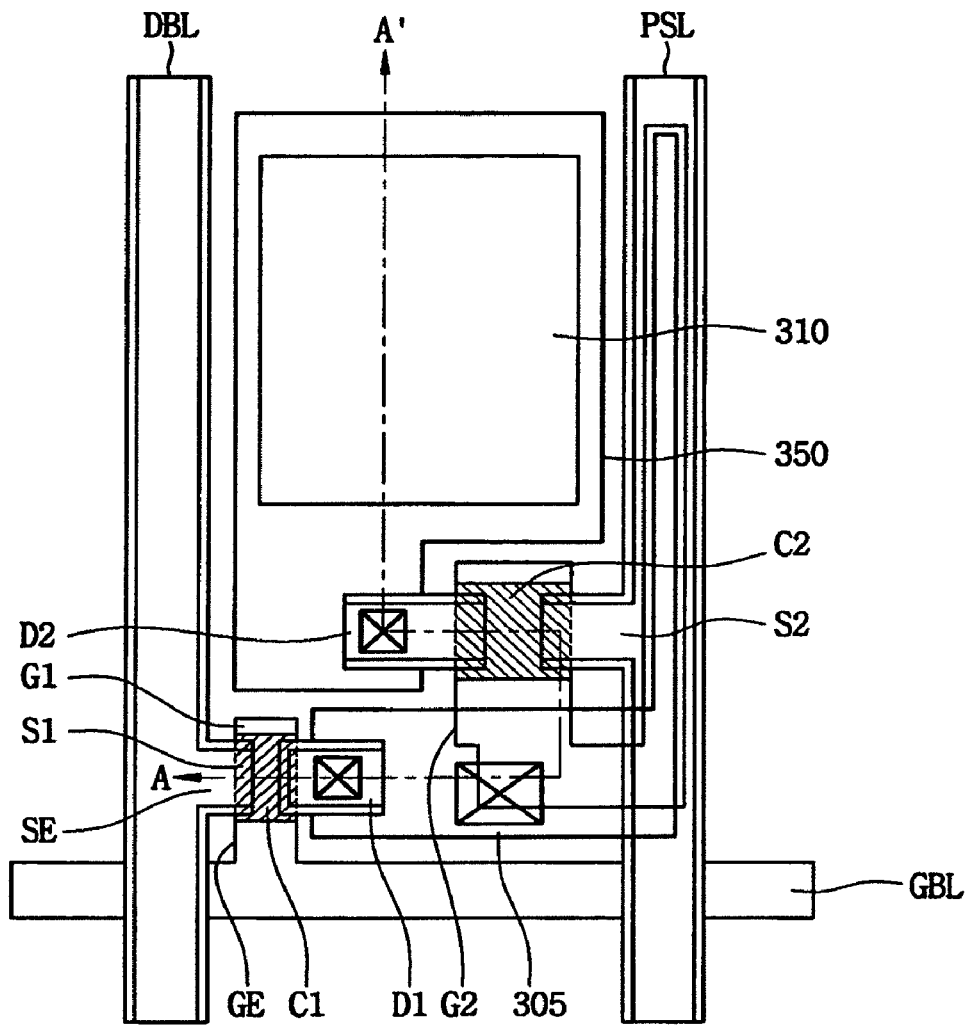
FIG. 3 is a schematic plan view of the electro-luminescence device shown in FIG. 2.
Figure 4:
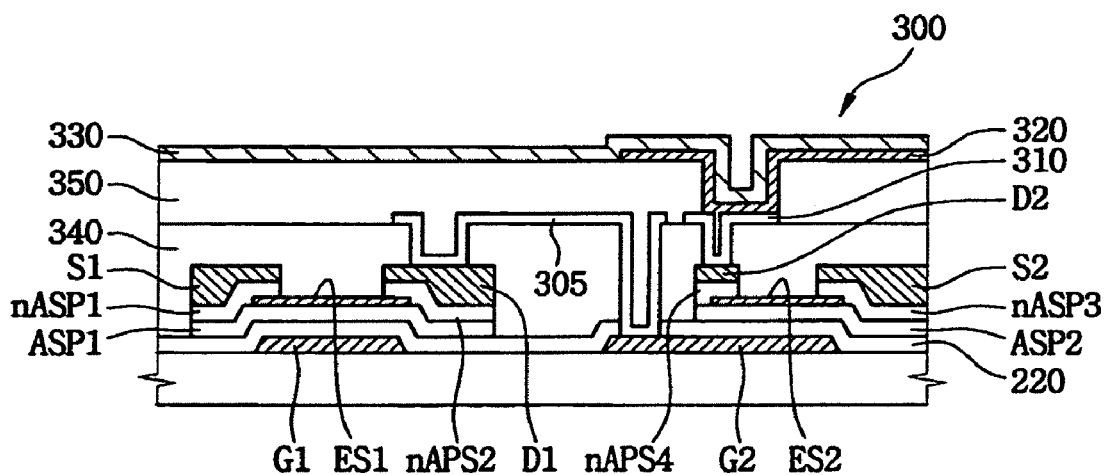
FIG. 4 is a cross-sectional view taken along the line A-A' of FIG. 3.

FIG. 2 is a schematic circuit diagram of an electro-luminescence device according to an exemplary embodiment of the present invention. FIG. 3 is a schematic plan view of the electro-luminescence device shown in FIG. 2. FIG. 4 is a cross-sectional view taken along the line A-A' of FIG. 3.

Referring to FIGS. 2 to 4, an electro-luminescence device 200 is formed on the substrate 10 shown in FIG. 2. The electro-luminescence device 200 includes a switching transistor TFT1, a driving transistor TFT2, a storage capacitor Cst, a gate bus line GBL, a data bus line DBL, a power supply line PSL and an electro-luminescence element EL.

The gate bus line GBL extends in a first direction D1. The gate bus line GBL is formed of a material having low electric resistance, such as, for example, aluminum or aluminum alloy. The electro-luminescence device 200 may include a plurality of gate bus lines GBL. For example, when the electro-luminescence device 200 has a resolution of 1024×768, the electro-luminescence device 200 includes 768 units of gate bus lines GBL. Each of the gate bus lines GBL extend in the first direction D1, and are arranged parallel to one another in a second direction D2 substantially perpendicular to the first direction D1. The gate bus line GBL further includes a gate electrode GE that extends in the second direction D2 from the gate bus line GBL. When the electro-luminescence device 200 has a resolution of 1024×768, 1024×3 units of gate electrodes GE are formed at the gate bus line GBL.

The data bus line DBL extends in the second direction D2. The data bus line DBL is formed of a material having low electric resistance, such as, for example, aluminum or aluminum alloy. The electro-luminescence device 200 may include a plurality of data bus lines DBL. For example, when the electro-luminescence device 200 has a resolution of 1024×768, the electro-luminescence device 200 includes 1024×3 units of data bus lines DBL. Each of the data bus lines DBL extends in the second direction D2, and are arranged parallel to one another in the first direction D1. The data bus line DBL further includes a source electrode SE that extends from the data bus line DBL in the first direction D1. When the electro-luminescence device 200 has a resolution of 1024×768, 768 units of source electrodes SE are formed at the data bus line DBL.

The power supply line PSL is formed adjacent to each data bus lines DBL. The power supply line PSL extends in the second direction D2, and receives a direct current signal Vdd.

The switching transistor TFT1 and driving transistor TFT2 are formed at every pixel area 210 defined by the gate bus line GBL, data bus line DBL and power supply line PSL.

The switching transistor TFT1 includes a first gate electrode G1, a first semiconductor pattern C1, a first etch stop pattern ES1, a first source electrode S1 and a first drain electrode D1.

The first gate electrode G1 is electrically connected to the gate electrode GE extending from the gate bus line GBL.

The first semiconductor pattern C1 is disposed on the first gate electrode G1. Referring to FIG. 4, the first semiconductor pattern C1 is insulated from the first gate electrode G1 by an insulating layer 220. The first semiconductor pattern C1 includes a first amorphous silicon pattern ASP1, a first n+ amorphous silicon pattern nASP1 and a second n+ amorphous silicon pattern nASP2. In FIG. 2, the first semiconductor pattern C1 is the amorphous silicon pattern formed by patterning an amorphous silicon thin layer. The first n+ amorphous silicon pattern nASP1 and second n+ amorphous silicon pattern nASP2 are disposed on the first amorphous silicon pattern ASP1, and spaced apart from each other with a predetermined distance. The first n+ amorphous silicon pattern nASP1 and second n+ amorphous silicon pattern nASP2 are formed by patterning an n+ amorphous silicon thin layer into which a dopant is injected.

The first etch stop pattern ES1 is disposed between the first amorphous silicon pattern ASP1 and first and second n+ amorphous silicon patterns nASP1 and nASP2. The first etch stop pattern ES1 may prevent the first amorphous silicon pattern ASP1 from being damaged or etched when the first n+ amorphous silicon pattern nASP1 and second n+ amorphous silicon pattern nASP2 are formed, thereby preventing a change in the amount of current flowing through the first amorphous silicon pattern ASP1.

The first source electrode S1 is disposed on the first n+ amorphous silicon pattern nASP1, and electrically connected to the first n+ amorphous silicon pattern nASP1. A portion of the first source electrode S1 is electrically connected to the source electrode SE extended from the data bus line DBL.

The drain electrode D1 is disposed on the second n+ amorphous silicon pattern nASP2, and electrically connected to the second n+ amorphous silicon pattern nASP2.

As shown in FIG. 2, the driving transistor TFT2 is disposed in the pixel area 210. The driving transistor TFT2 includes a second gate electrode G2, a second semiconductor pattern C2, a second etch stop pattern ES2, a second source electrode S2 and a second drain electrode D2.

The second gate electrode G2 is electrically connected to the first drain electrode D1 of the switching transistor TFT 1.

The second semiconductor pattern C2 is disposed on the second gate electrode G2. The second semiconductor pattern C2 is insulated from the second gate electrode G2 by the insulating layer 220. The second semiconductor pattern C2 includes a second amorphous silicon pattern ASP2, a third n$^+$ amorphous silicon pattern nASP3 and a fourth n$^+$ amorphous silicon pattern nASP4. The second semiconductor pattern C2 is formed by patterning the amorphous silicon thin layer. The third n$^+$ amorphous silicon pattern nASP3 and fourth n$^+$ amorphous silicon pattern nASP4 are disposed on the second amorphous silicon pattern ASP2, and spaced apart from each other with a predetermined distance. The third n$^+$ amorphous silicon pattern nASP3 and fourth n$^+$ amorphous silicon pattern nASP4 are formed by patterning an n$^+$ amorphous silicon thin layer into which a dopant is injected.

The second etch stop pattern ES2 is disposed between the second amorphous silicon pattern ASP2 and third and fourth n$^+$ amorphous silicon patterns nASP3 and nASP4. The second etch stop pattern ES2 may prevent the second amorphous silicon pattern ASP2 from being damaged or etched when the third n$^+$ amorphous silicon pattern nASP3 and fourth n$^+$ amorphous silicon pattern nASP4 are formed, thereby preventing a change in the amount of current flowing through the second amorphous silicon pattern ASP2.

The second source electrode S2 is disposed on the third n+ amorphous silicon pattern nASP3, and electrically connected to the power supply line PSL.

The second drain electrode D2 is disposed on the fourth n$^+$ amorphous silicon pattern nASP4, and electrically connected to an organic electro-luminescence element 300.

The storage capacitor Cst includes a first capacitor Cst1 of the second gate electrode G2, a second capacitor Cst2 of the power supply line PSL and a dielectric layer disposed between the first and second capacitors Cst1 and Cst2. The dielectric layer includes the insulating layer 220. The storage capacitor Cst turns on the second gate electrode G2 during a frame.

The organic electro-luminescence element 300 includes a connecting electrode 305, an anode electrode 310, an organic light emitting layer 320 and a cathode electrode 330. The reference numerals "340" and "350" indicate a first inter-insulating layer and a second inter-insulating layer, respectively.

The connecting electrode 305 connects the first drain electrode D1 of the switching transistor TFT1 to the second gate electrode G2. The connecting electrode 305 is formed of the same material as the anode electrode 310.

The anode electrode 310 is connected to the second drain electrode D2 of the driving transistor TFT2 so as to receive the driving current from the power supply line PSL. The anode electrode 310 is made of a transparent conductive material, such as, for example, indium tin oxide or indium zinc oxide.

The organic light emitting layer 320 includes one of a red organic light emitting material, a green organic light emitting material and a blue organic light emitting material. The red, green and blue light emitting materials are disposed between the anode and cathode electrodes 310 and 330.

The cathode electrode 330 facing the anode electrode 310 includes a metal thin layer made of, for example, aluminum or aluminum alloy.

According to this exemplary embodiment of the present invention, the electro-luminescence device may prevent the amorphous silicon pattern of the thin film transistor disposed at the pixel area from being damaged or etched when the n$^+$ amorphous silicon pattern is formed on the amorphous silicon pattern.

FIGS. 5-14 show a method of fabricating an electro-luminescence device according to an embodiment of the invention.

Figure 5:
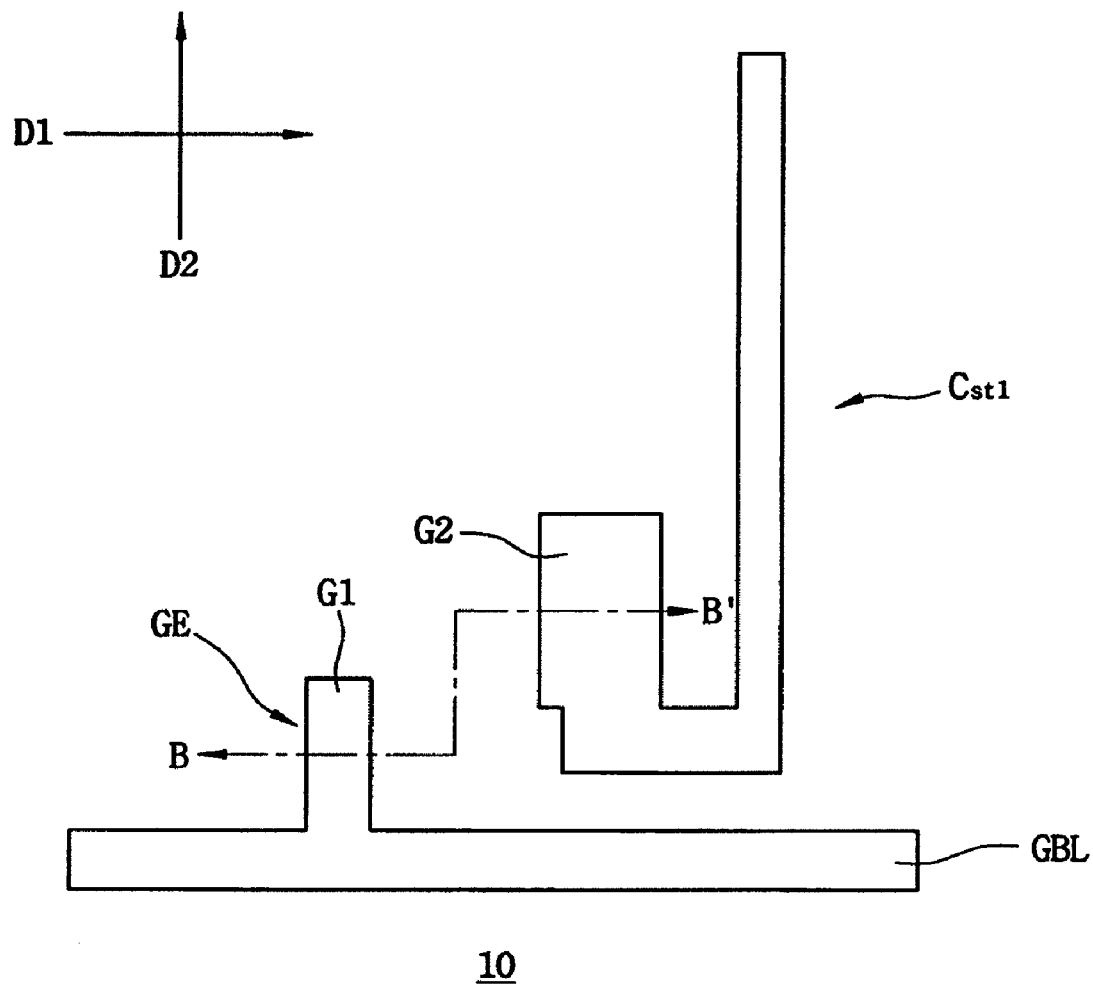
FIG. 5 is a schematic view showing first and second gate electrodes formed with a first mask according to an embodiment of the present invention.
Figure 6:
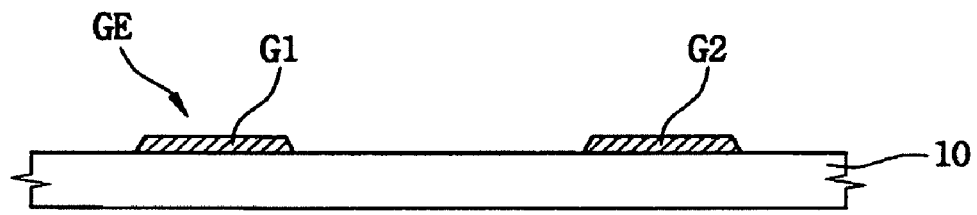
FIG. 6 is a schematic cross-sectional view taken along the line B-B' of FIG. 5.

FIG. 5 is a schematic view showing first and second gate electrodes formed with a first mask according to an embodiment of the invention. FIG. 6 is a schematic cross-sectional view taken along the line B-B' of FIG. 5.

Referring to FIGS. 5 and 6, a gate metal thin layer is formed over the substrate 10 by a chemical vapor deposition method or a sputtering method. A photoresist layer is coated on the gate metal thin layer. The photoresist layer is patterned using a first pattern mask to form a photoresist pattern on the gate metal thin layer. The gate metal thin layer is etched using the photoresist pattern as a mask, and the photoresist pattern is removed to simultaneously form the gate bus line GBL including the gate electrode GE and the second gate electrode G2 including the first capacitor electrode Cst1 of the storage capacitor Cst.

The gate bus line GBL formed using the first pattern mask extends in the first direction D1 on the substrate 10. The gate electrode GE extends from the gate bus line GBL in the second direction D2. A portion of the gate electrode GE operates as the first gate electrode G1. The second gate electrode G2 is formed at a position spaced apart from the gate electrode GE by a predetermined distance. The second gate electrode G2 extends in the first direction D1 and the first capacitor electrode Cst1 extends from the second gate electrode G2. The first capacitor electrode Cst1 extends in the second direction D2 and is spaced apart from the gate bus line GBL by a predetermined distance.

Figure 7:
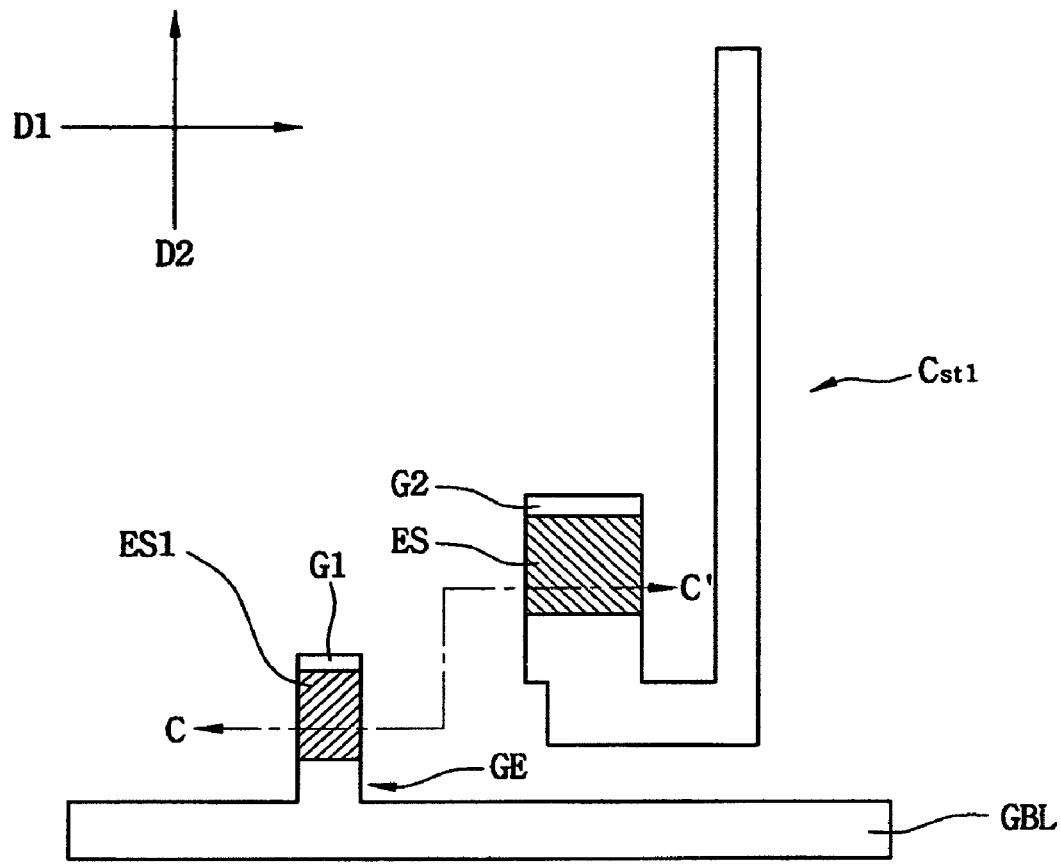
FIG. 7 is a schematic view showing first and second etch stop patterns formed with a second mask according to an embodiment of the present invention.
Figure 8:
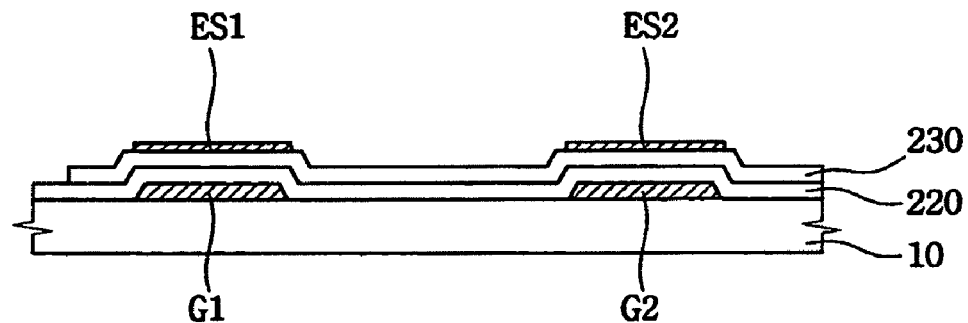
FIG. 8 is a schematic cross-sectional view taken along the line C-C' of FIG. 7.

FIG. 7 is a schematic view showing first and second etch stop layers formed with a second mask according to an embodiment of the invention. FIG. 8 is a schematic cross-sectional view taken along the line C-C' of FIG. 7.

Referring to FIGS. 7 and 8, the insulating layer 220 is formed over the substrate 10. The insulating layer 220 covers the gate bus line GBL on which the gate electrode GE is formed, second gate electrode G2 and first capacitor electrode Cst1.

Referring to FIG. 8, a first semiconductor layer 230 is formed on the insulating layer 220 by a chemical vapor deposition method. The first semiconductor layer 230 includes an amorphous silicon thin layer. An etch stop layer is formed over the first semiconductor layer 230, and then a photoresist layer is formed on the etch stop layer using a spin coating method or a slit coating method. The photoresist layer is patterned using a second pattern mask to form a photoresist pattern on the etch stop layer. The first and second etch stop patterns ES1 and ES2 are formed on the first semiconductor layer 230 by etching the etch stop layer using the photoresist layer as a mask. The first etch stop pattern ES1 is formed on a portion of the semiconductor layer 230 corresponding to the first gate electrode G1, and the second etch stop pattern ES2 is formed on a portion of the semiconductor layer 230 corresponding to the second gate electrode G2.

Figure 9:
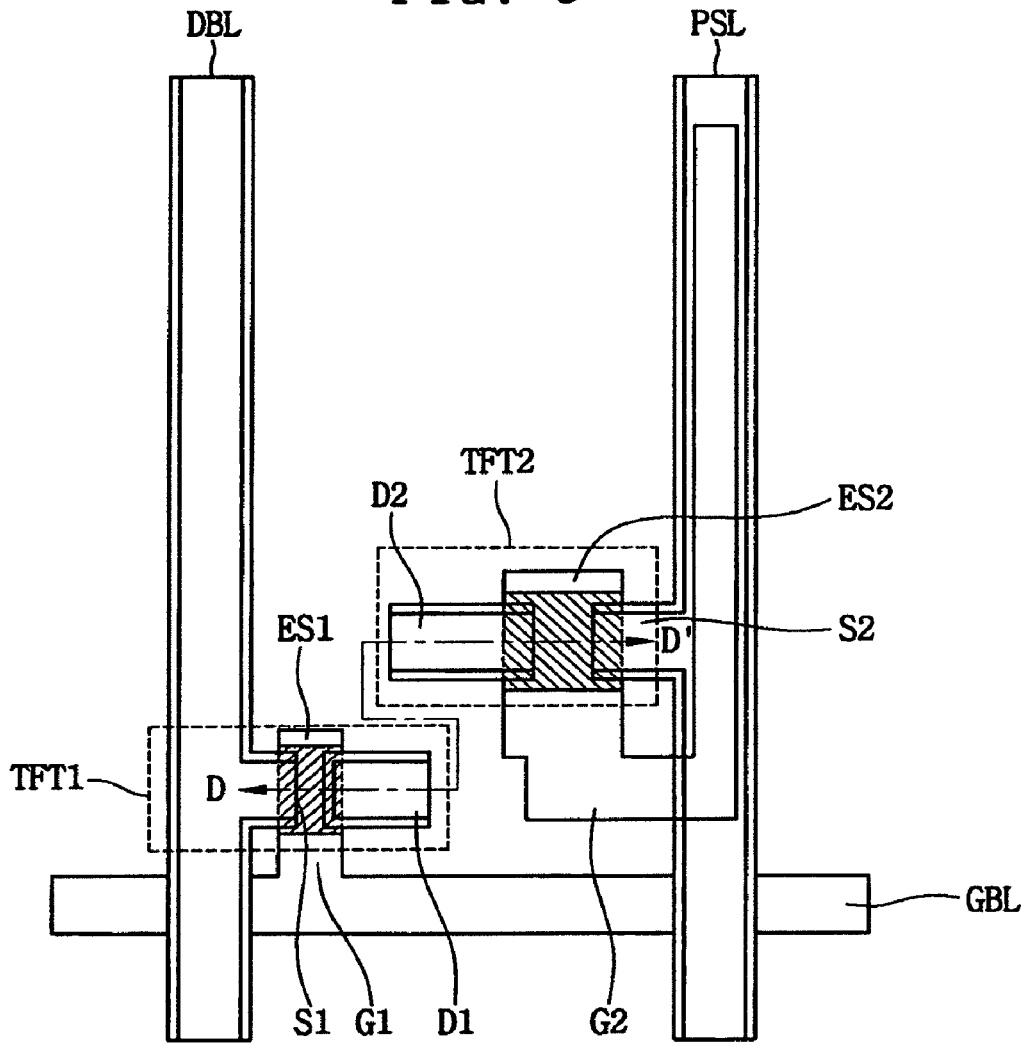
FIG. 9 is a schematic view showing first and second source electrodes, and first and second drain electrodes formed with a third mask according to an embodiment of the present invention.
Figure 10:
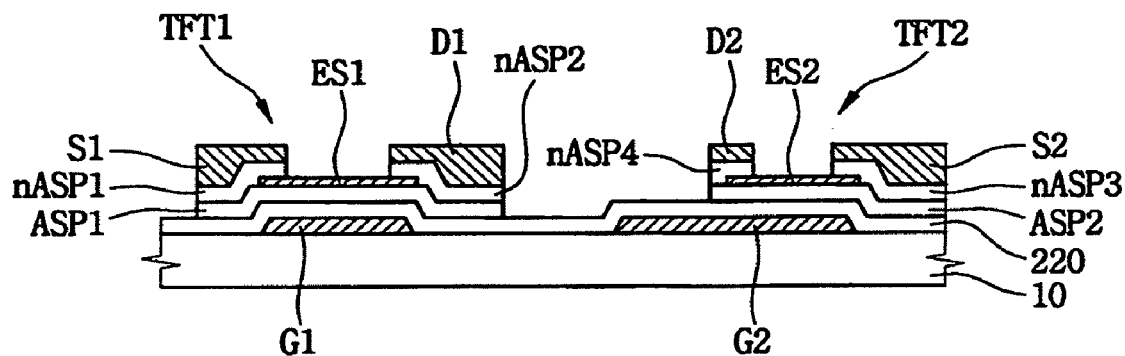
FIG. 10 is a schematic cross-sectional view taken along the line D-D' of FIG. 9.

FIG. 9 is a schematic view showing first and second source electrodes, and first and second drain electrodes formed with a third mask according to an embodiment of the invention. FIG. 10 is a schematic cross-sectional view taken along the line D-D' of FIG. 9.

Referring to FIGS. 9 and 10, a second semiconductor layer is formed on the first semiconductor layer 230 shown in FIG. 8 by a chemical vapor deposition method to cover the first and second etch stop patterns ES1 and ES2. A source/drain metal thin layer is formed on the second semiconductor layer using a chemical vapor deposition method or a sputtering method. A photoresist layer is formed on the source/drain metal thin layer by a spin coating method or a slit coating method. The photoresist layer is patterned using a third pattern mask to form a photoresist pattern on the source/drain metal thin layer. The photoresist pattern has a lower height at center portions of the first and second etch stop patterns ES1 and ES2 than at end portions thereof. To differentiate the height at the center portions from the end portions, the photoresist pattern at center portions of the first and second etch stop patterns ES1 and ES2 are exposed with a slit exposure method using the third pattern mask. When the source/drain metal thin layer is patterned using the photoresist pattern as a mask, the data bus line DBL, first drain electrode D1, power supply line PSL on which the second source electrode S2 is formed, and second drain electrode D2 are simultaneously formed on the substrate 10. The second semiconductor layer and first semiconductor layer 230 are patterned using the data bus line DBL including the first source electrode S1, first drain electrode D1, power supply line PSL including the second source electrode S2 and the second drain electrode D2 as a mask. The second semiconductor layer has the same shape as that of the data bus line DBL including the first source electrode S1, first drain electrode D1, power supply line PSL including the second source electrode S2 and the second drain electrode D2. Thus, the first $n^+$ amorphous silicon pattern nASP1 and second $n^+$ amorphous silicon pattern nASP2 are formed under the first source electrode S1 and first drain electrode D1, respectively. Also, the third $n^+$ amorphous silicon pattern nASP3 and fourth $n^+$ amorphous silicon pattern nASP4 are formed under the second source electrode S2 and second drain electrode D2, respectively. The first $n^+$ amorphous silicon pattern nASP1 and second $n^+$ amorphous silicon pattern nASP2 are spaced apart from each other, and the third $n^+$ amorphous silicon pattern nASP3 and fourth $n^+$ amorphous silicon pattern nASP4 are spaced apart from each other.

The first semiconductor layer 230 has the same shape as that of the data bus line DBL including the first source electrode S1, first drain electrode D1, power supply line PSL including the second source electrode S2 and the second drain electrode D2. Thus, the first amorphous silicon pattern ASP1 is formed under the first $n^+$ amorphous silicon pattern nASP1 and second $n^+$ amorphous silicon pattern nASP2, and the second amorphous silicon pattern ASP2 is formed under the third $n^+$ amorphous silicon pattern nASP3 and fourth $n^+$ amorphous silicon pattern nASP4. The first $n^+$ amorphous silicon pattern nASP1, first etch stop pattern ES1 and second $n^+$ amorphous silicon pattern nASP2 may prevent a center portion of the first amorphous silicon pattern ASP1 from being etched. Also, the third $n^+$ amorphous silicon pattern nASP3, second etch stop pattern ES2 and fourth $n^+$ amorphous silicon pattern nASP4 may prevent a center portion of the second amorphous silicon pattern ASP2 from being etched.

Figure 11:
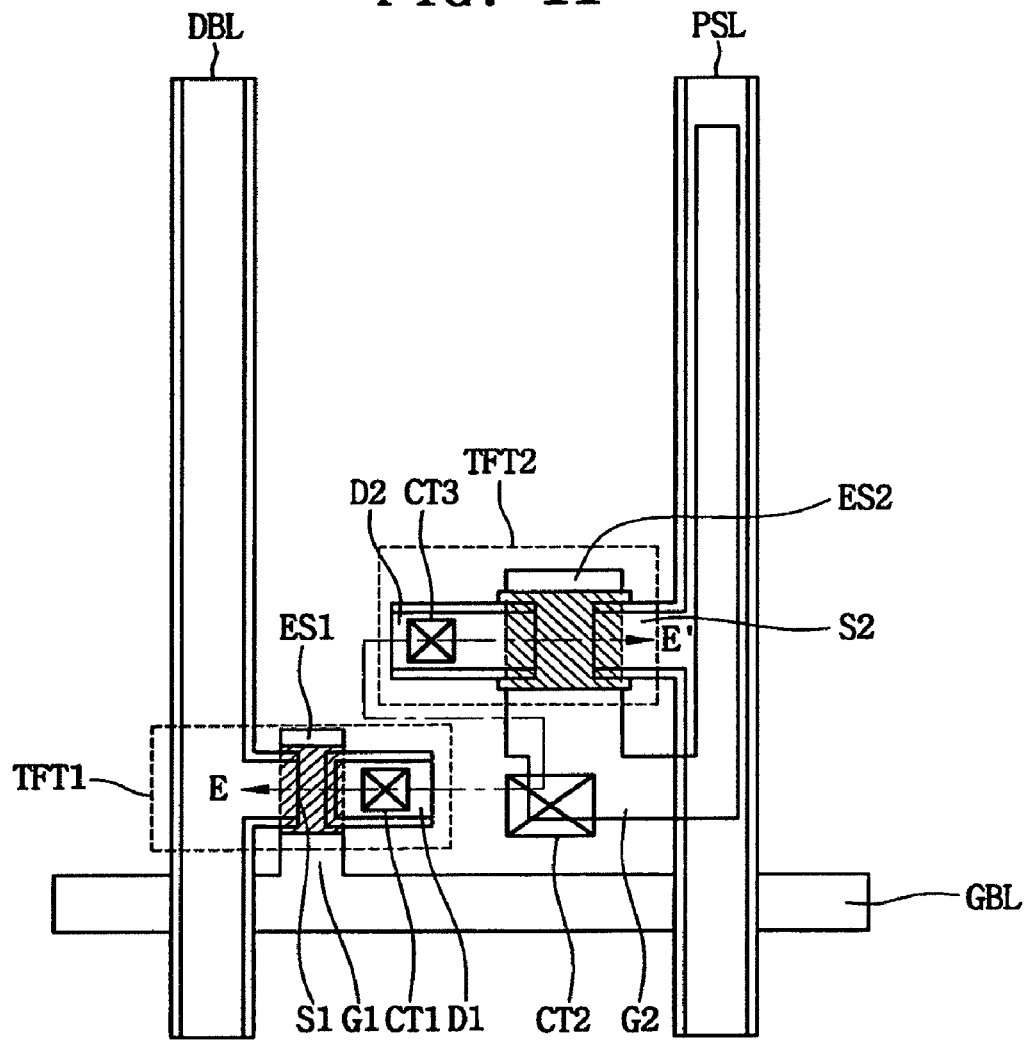
FIG. 11 is a schematic view showing a contact hole formed at first and second drain electrodes formed with a fourth mask according to an embodiment of the present invention.
Figure 12:
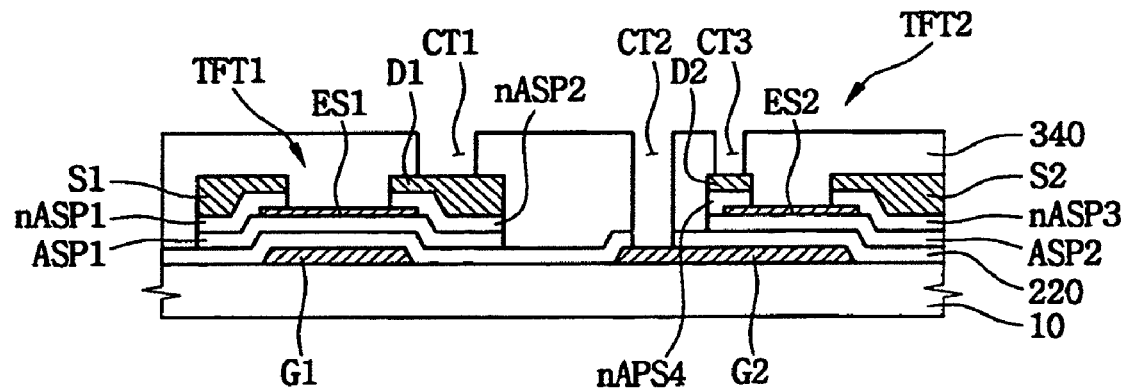
FIG. 12 is a schematic cross-sectional view taken along the line E-E' of FIG. 11.

FIG. 11 is a schematic view showing contact holes at first and second drain electrodes formed with a fourth mask according to an embodiment of the invention. FIG. 12 is a schematic cross-sectional view taken along the line E-E' of FIG. 11.

Referring to FIGS. 11 and 12, the first inter-insulating layer 340 is formed over the substrate 10 by a chemical vapor deposition method. A photoresist layer is formed on the first inter-insulating layer 340 using a spin coating method or a slit coating method. The photoresist layer is patterned using a fourth pattern mask to form a photoresist pattern on the substrate 10. A first contact hole CT1 partially exposing the first drain electrode D1, a second contact hole CT2 partially exposing the second gate electrode G2 and a third contact hole CT3 partially exposing the second drain electrode D2 are formed at the first inter-insulating layer 340 by etching the first inter-insulating layer 340 using the photoresist pattern as a mask.

Figure 13:
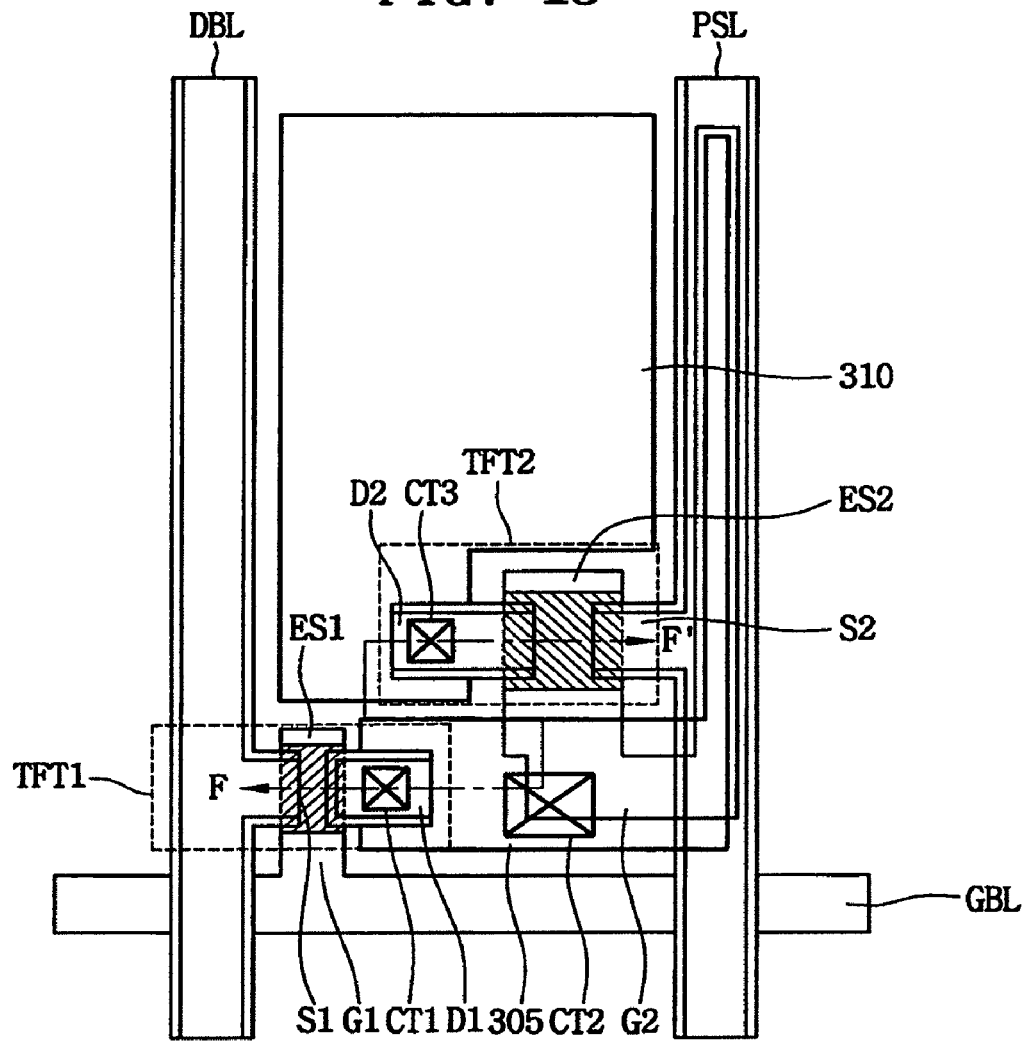
FIG. 13 is a schematic view showing a connecting electrode and an anode electrode formed with a fifth mask according to an embodiment of the present invention.
Figure 14:
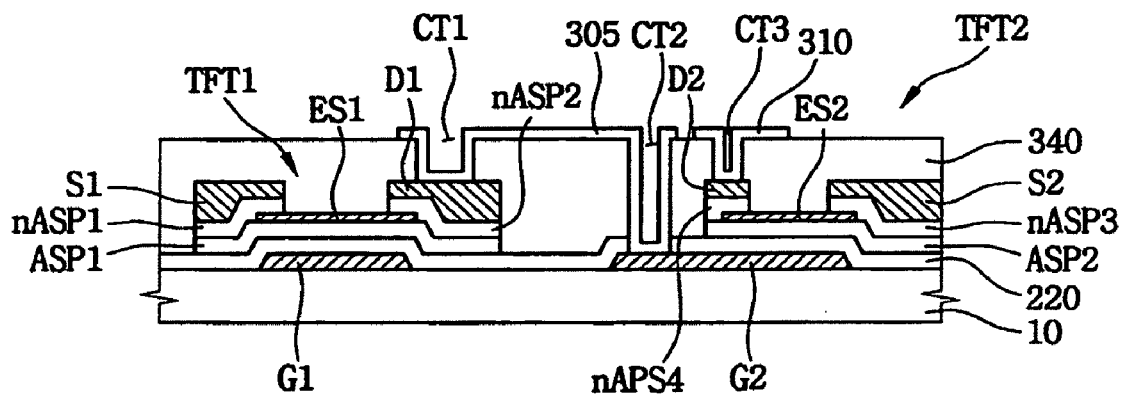
FIG. 14 is a schematic cross-sectional view taken along the line F-F' of FIG. 13.

FIG. 13 is a schematic view showing a connecting electrode and an anode electrode formed with a fifth mask according to an embodiment of the invention. FIG. 14 is a schematic cross-sectional view taken along the line F-F' of FIG. 13.

Referring to FIGS. 13 and 14, a transparent conductive anode thin layer is formed over the first inter-insulating layer 340. A photoresist layer is coated on the anode thin layer by a spin coating method or a slit coating method, and a fifth pattern mask is aligned with the substrate 10. The photoresist layer is patterned using the fifth mask to form a photoresist pattern on the anode thin layer. The anode electrode 310 and connecting electrode 305 are formed by etching the anode thin layer using the photoresist pattern as a mask. The anode electrode 310 is connected to the second drain electrode D2 through the third contact hole CT3. Also, the connecting electrode 305 is connected to the first drain electrode D1 and second gate electrode G2 through the first contact hole CT1 and second contact hole CT2, respectively.

Referring to FIGS. 3 and 4 again, the second inter-insulating layer 350 is formed on the first inter-insulating layer 340, and a photoresist layer is formed on the second inter-insulating layer 350 using a spin coating method or a slit coating method. After aligning a sixth pattern mask with the substrate 10, the photoresist layer is patterned using the sixth pattern mask to form a photoresist pattern on the second inter-insulating layer 350.

The second inter-insulating layer 350 is patterned using the photoresist pattern to form an opening in the second inter-insulating layer 350, through which the anode electrode 310 is exposed.

The organic light emitting layer including the red, green and blue organic light emitting layers is formed on the anode electrode 310, and the cathode electrode 330 is formed on the organic light emitting layer 320 by patterning a metal thin layer.

Although not shown in FIGS. 3 and 4, to protect the organic light emitting layer 320 from oxygen or humidity, a sealing cap may be further formed at the cathode electrode 330.

An electro-luminescence device according to various exemplary embodiments of the invention may prevent distortion of the driving current caused by a damaged semiconductor layer of a thin film transistor, thereby improving display quality of the image.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. An electro-luminescence device comprising:
an electro-luminescence element; and
a thin film transistor electrically connected to the electro-luminescence element, the thin film transistor comprising:
a gate electrode disposed on a substrate;
an insulating layer disposed on the gate electrode;

a first semiconductor pattern disposed on the insulating layer;

an etch stop layer disposed on the first semiconductor layer;

a source electrode disposed on the first semiconductor pattern; and a drain electrode disposed on the first semiconductor pattern spaced apart from the source electrode.

2. The electro-luminescence device of claim 1, wherein the thin film transistor further comprises:

a second semiconductor pattern disposed between the etch stop layer and the source electrode; and a third semiconductor pattern disposed between the etch stopper layer and the drain electrode layer.

3. The electro-luminescence device of claim 2, wherein the second semiconductor pattern and the third semiconductor pattern comprise n+ silicon pattern.

4. The electro-luminescence device of claim 1, wherein the electro-luminescence element comprises:

an anode electrode;

a light emitting layer formed over the anode electrode; and a cathode electrode formed over the light emitting layer.

5. The electro-luminescence device of claim 4, wherein the anode electrode is electrically connected to the drain electrode of the thin film transistor.

6. The electro-luminescence device of claim 4, wherein the light emitting layer is an organic light emitting layer.

7. An electro-luminescence device, comprising:

a gate bus line extending in a first direction over a substrate;

a data bus line extending in a second direction over the substrate;

a power supply line extending parallel to the data bus line over the substrate;

a switching transistor electrically connected to the gate bus line, the switching transistor comprising:

a first gate electrode extending from the gate bus line;

a first semiconductor pattern formed on the first gate electrode;

a first etch stop layer formed on the first semiconductor pattern;

a first source electrode formed on the first semiconductor pattern, the first source electrode extending from the data bus line; and a first drain electrode formed on the first semiconductor pattern;

a driving transistor electrically connected to the power supply line, the driving transistor comprising:

a second gate electrode electrically connected to the first drain electrode of the switching transistor;

a fourth semiconductor pattern formed over the second gate electrode;

a second etch stop layer formed over the fourth semiconductor pattern;

a second source electrode formed on the fourth semiconductor layer, the second source electrode extending from the power supply line; and a second drain electrode formed on the fourth semiconductor layer;

an electro-luminescence element electrically connected to the second drain electrode of the driving transistor.

8. The electro-luminescence device of claim 7, wherein the switching transistor further comprises:

a second semiconductor pattern disposed between the first semiconductor pattern and the first source electrode; and a third semiconductor pattern disposed between the first semiconductor pattern and the first drain electrode, and wherein the driving transistor further comprises:

a fifth semiconductor pattern disposed between the fourth semiconductor pattern and the second source electrode; and a sixth semiconductor pattern disposed between the fourth semiconductor pattern and the second drain electrode.

9. The electro-luminescence device of claim 8, wherein the second, third, fifth and sixth semiconductor patterns comprise n+ silicon pattern.

10. The electro-luminescence device of claim 7, wherein the electro-luminescence element comprises:

an anode electrode electrically connected to the second drain electrode of the driving transistor;

a light emitting layer formed over the anode electrode; and a cathode electrode formed over the light emitting layer.

11. The electro-luminescence device of claim 10, wherein the light emitting layer is an organic light emitting layer.

12. The electro-luminescence device of claim 7, wherein the first and fourth semiconductor patterns are formed of an amorphous silicon film.

13. The electro-luminescence device of claim 7, wherein the first and second etch stop layers have a thickness of about 100 Å to about 200 Å.

14. The electro-luminescence device of claim 7, further comprising:

a connecting electrode that connects the first drain electrode to the second gate electrode.

* * * * *